(12) United States Patent
Hopper et al.

(10) Patent No.: US 7,298,653 B1
(45) Date of Patent: Nov. 20, 2007

(54) REDUCING CROSS DIE VARIABILITY IN AN EEPROM ARRAY

(75) Inventors: Peter J. Hopper, San Jose, CA (US); Philipp Lindorfer, San Jose, CA (US); Vladislav Vashchenko, Palo Alto, CA (US); Yuri Mirgorodski, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 142 days.

(21) Appl. No.: 10/873,872

(22) Filed: Jun. 21, 2004

(51) Int. Cl.
*G11C 11/34* (2006.01)
(52) U.S. Cl. .............................. 365/185.28; 365/185.25
(58) Field of Classification Search ........... 365/185.28, 365/185.25
See application file for complete search history.

(56) References Cited

U.S. PATENT DOCUMENTS 5,825,782 A * 10/1998 Roohparvar ................. 714/718
6,856,548 B2 * 2/2005 Tanzawa et al. ........ 365/185.22

* cited by examiner

*Primary Examiner*—Michael Tran
(74) *Attorney, Agent, or Firm*—Jurgen Vollrath

(57) ABSTRACT

In an EEPROM array the cells are pre-charged or pre-erased so that they will respond uniformly to the same read voltage level. By clearly defining the threshold voltage for the cells in their erased states and in their programmed states, it is possible to define more than one read voltage and thus provide cells that an store multiple values and even analog values.

18 Claims, 3 Drawing Sheets

REDUCING CROSS DIE VARIABILITY IN AN EEPROM ARRAY

FIELD OF THE INVENTION

The invention relates to EEPROM arrays and a method of reducing variations between memory cells across an array. In particular it relates to the prior art problem associated with variations in the threshold voltage required to determine whether or not an EEPROM cell has been programmed.

BACKGROUND OF THE INVENTION

EEPROM cells make use of a dual gate structure to place an electric field over a field region between two p+ composite regions. The p+ composite regions are commonly referred to as drain and source regions since the structure is essentially a dual gate PMOS transistor.

EEPROMs typically come in one of two configurations: stacked EEPROM, as shown in FIG. 1, and free EEPROMs as shown in FIG. 2. The stacked EEPROM structure of FIG. 1 includes two polygates 100,102 stacked on top of each other. The top gate 100 is connected to a voltage source while the lower gate 102 is not externally connected and is thus floating. The gates 100, 102 are separated by an oxide 104, thus when a voltage is applied to the gate 100, the two gates act as a first capacitor. Similarly, the lower gate 102 is spaced from the active region 106 by a gate oxide, or tunneling oxide 108, thereby creating a second capacitor, which is formed in series with the first capacitor. Typically, the areas of the oxide regions 104, 108 are chosen so that the capacitance of the first capacitor (formed by the two gates 100, 102) is substantially larger (typically >5 times larger) than the capacitance of the lower (second) capacitor (formed by the lower gate 102 and the active region 106). It will be appreciated that oxide thickness can also be chosen to adjust the capacitance ratio. Thus when a voltage is applied to the top gate 100, a lower voltage (10× lower in the case where the top capacitor has 10× the capacitance of the lower capacitor) will appear across the lower capacitor. As part of the active region 106 are p+ composite regions on either side of a well. These composite regions define a drain region 110, and a source region 112 of a transistor.

FIG. 2 shows a plan view of a free EEPROM 200. In this configuration the first capacitor 202 is formed laterally spaced from the second capacitor 204. The first capacitor 202 is again substantially larger than the second capacitor 204, as is discussed in more detail below. In this case, however, they share one continuous common polysilicon floating gate region 206. The second capacitor 204 is defined by the common floating gate 206 separated by an oxide layer 320, from an active region (in particular from an n-well 300), as shown in FIG. 3. FIG. 3 is a sectional view of the left hand portion of the EEPROM 200 along the line A—A. As can be seen from FIG. 3, this left hand portion defines a PMOS transistor with p+ drain and source regions 302, 304 on either side of the n-well 300. FIG. 4, in turn, shows a section along B—B of the right hand portion of the EEPROM 200. The right hand portion also defines a PMOS transistor. In this case the p+ regions 210 formed on either side of an n-well 410, form a second active region to define a control gate (non-floating gate). The control gate 210 is provided with a control gate contact 420. As mentioned above, the first capacitor 202 is substantially larger than the second capacitor 204. This is achieved, in this free EEPROM configuration, by means of the E-shaped polysilicon region 206, which provides a large periphery and thus a large capacitor area, best seen in the plan view of FIG. 2. The capacitor 202 is thus defined by the control gate 210 separated by the oxide region 320 from the floating gate 206. The location of the contact 420 of the control gate 210 is indicated in FIGS. 2 and 4. The control gate 210 serves to erase the EEPROM, as is discussed in greater detail below, and the floating gate 206 is used for programming the EEPROM.

In order to better appreciate the purpose of the capacitors in an EEPROM cell, it is useful to consider the three modes that an EEPROM can operate in: program mode, erase mode, read mode.

The read mode seeks to determine the state of a memory cell by supplying the first polygate with a certain read voltage and monitoring the drain current. In the case of the stacked configuration the drain current is the current flowing between drain 108 and source 110, and in the case of the free configuration, it is the current flowing between drain 302 and source 304. In order to affect the drain current so as to distinguish between a programmed memory cell and an unprogrammed cell, the cells in an array structure are first erased and then selectively programmed.

Program Mode:

During the program mode, in order to program a memory cell, a programming voltage, e.g. 10V is applied to the non-floating gate (gate 100 in the case of the FIG. 1 configuration, and gate 200 in the case of the FIGS. 2–4 configuration). Due to the capacitor ratio, which is 10:1 in the example discussed above, 10V applied to the gate 100 or gate 200 appears as approximately 1 V across the second capacitor. The resultant electric field across the second capacitor attracts electrons. Thus, it provides hot electron injection into the second (floating) gate. Thus, once programmed, there is an electron charge on the floating gate 102, 202.

Read mode: In order to read a cell, a relatively small read voltage, e.g. 1V, is applied to the control gate 100, 210. This voltage provides a voltage of about 0.1V across the second capacitor and has the effect of attracting any electrons that were injected into the floating gate. By attracting the electrons in the floating gate sufficiently strongly, the electric field across the second capacitor is reduced, allowing drain current to flow. It will be appreciated that in the case of an unprogrammed cell, where there is essentially no charge on the second capacitor, very low gate voltage will suffice to produce drain current. Also, in the case of a programmed cell, it will be appreciated that depending on the amount of charge on the second capacitor the read voltage required to achieve drain current flow will vary. For any particular cell, a read voltage can thus be chosen at which drain current will flow for an unprogrammed cell but where the voltage is not large enough to achieve drain current in the case of a programmed cell, i.e., the read voltage lies between the threshold voltage Vth for a programmed cell and the Vth for an unprogrammed or erased cell.

However, due to minor structural variations between memory cells in an array, the threshold voltages will vary. For example, varying amounts of nitride impurities in the oxide 108, 320 will result in varying numbers of electron and/or hole traps in the oxide, thereby affecting the threshold voltages. Thus different cells in an array will have different electric fields across their floating capacitors and will require different threshold voltages Vth to achieve drain current flow. This is best illustrated by the Vth curves across an array (in this case a die defining an array of memory cells), as shown in FIG. 5. The upper curve 500 shows the varying threshold voltages to achieve drain current flow when the cells are programmed. The lower curve 502 shows the varying threshold voltages to achieve drain current flow when the cells are not programmed. If a single threshold voltage is selected for reading all of the cells, e.g., the read voltage indicated by the broken line 504, it will be noted that some cells will provide a wrong result. For instance the cell defined by the threshold voltage 510 would not produce a drain current even if erased since its threshold voltage is higher than the chosen read voltage 504. Similarly, the cell next to it would provide incorrect results since it would always show a drain current at the chosen read voltage of 504, even if it is programmed (since not only is its threshold voltage when unprogrammed, but also its threshold voltage when programmed, lower than the chosen read voltage 504).

Erase Mode:

As mentioned above, prior to programming EEPROM memory cells, the entire array or, in some types of EEPROMs, entire sectors in the array are first erased. This is done by "sucking" off electrons from the floating gate by Fowler-Nordheim effect, which involves applying a large electric field to the top or bottom of the capacitor and pulling off the electrons. When sucking electrons off the top of the capacitor, this can be done by keeping the drain at 0V to avoid further electrons being injected in from the bottom of the floating gate, and applying a large positive voltage to the non-floating gate to suck off the electrons off the top through the non-floating gate by Fowler-Nordheim effect. Instead, the electrons can be sucked off the bottom by holding the non-floating gate at 0V and applying a large positive voltage to the drain 110, 302.

As discussed above, the variations between the cells in an array creates a problem when trying to use a single threshold voltage, as a threshold judgment criteria, to determine whether or not a cell is programmed or erased, i.e., using a single threshold voltage during the read operation, for all cells in the array.

SUMMARY OF THE INVENTION

The present invention includes a method of providing an EEPROM array with a common read voltage across all cells, comprising pre-programming the cells so that all of the cells have substantially the same threshold voltage. Preferably the programmed threshold voltage are substantially the same for all the cells in the array and the unprogrammed threshold voltage are preferably also substantially the same for all the cells in the array. It will, however, be appreciated that the resultant common programmed and unprogrammed threshold voltages are different from each other. The pre-programming typically comprises adding or removing charge from the cells. EEPROM cells each typically include two capacitors, and the step of adding or removing charge comprises adding or removing charge from the capacitors.

A first one of the capacitors may be defined by a non-floating gate separated from a floating gate, and the step of adding charge may comprises applying a positive voltage to the non-floating gate. The second of the capacitors may be defined by the floating gate spaced from an active region, and the step of removing charge comprises sucking off charge from the second capacitor. The pre-programming of each of the cells may be done by providing a circuit that measures the threshold voltage of the cell in its erased state and compares it to a reference voltage, and adds or removes charge from the cell to align the threshold voltage substantially with the reference voltage. Preferably the same is done for each cell in its programmed state by comparing it to a second reference voltage. In this way all the cells are aligned with a lower and an upper reference voltage. The adding or removing of charge may be done iteratively by generating voltage pulses and counting the number of voltage pulses required to align the threshold voltage substantially with the reference voltage.

Further, according to the invention, there is provided a method of providing a multi-cell EEPROM array capable of storing an analog value, comprising providing a multi-cell EEPROM array, pre-programming the cells so that all of the cells have substantially the same threshold voltage in their erased states and all of the cells have substantially the same threshold voltage in their programmed states.

Still further, the invention includes providing a multi-cell EEPROM array wherein each cell is capable of storing multiple values, comprising providing a multi-cell EEPROM array, pre-programming the cells so that all of the cells have substantially the same threshold voltage in their erased states and all of the cells have substantially the same threshold voltage in their programmed states.

DETAILED DESCRIPTION OF THE INVENTION

The present invention seeks to address some of the problems encountered with EEPROM arrays by individually pre-charging or erasing each of the memory cells by some amount so that the resultant charge on the floating gate capacitors of the EEPROM cells is such that a threshold voltage reference level can be used to read each of the cells.

Figure 1:
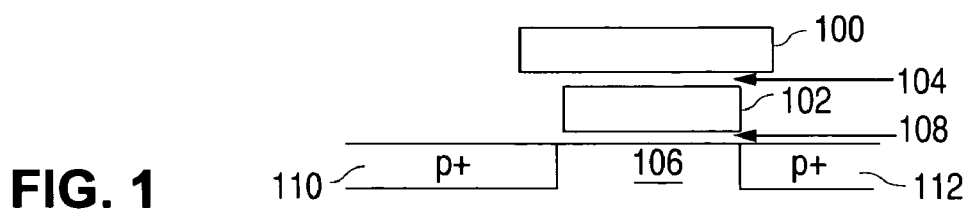
FIG. 1 is a sectional view of one prior art EEPROM cell.
Figure 2:
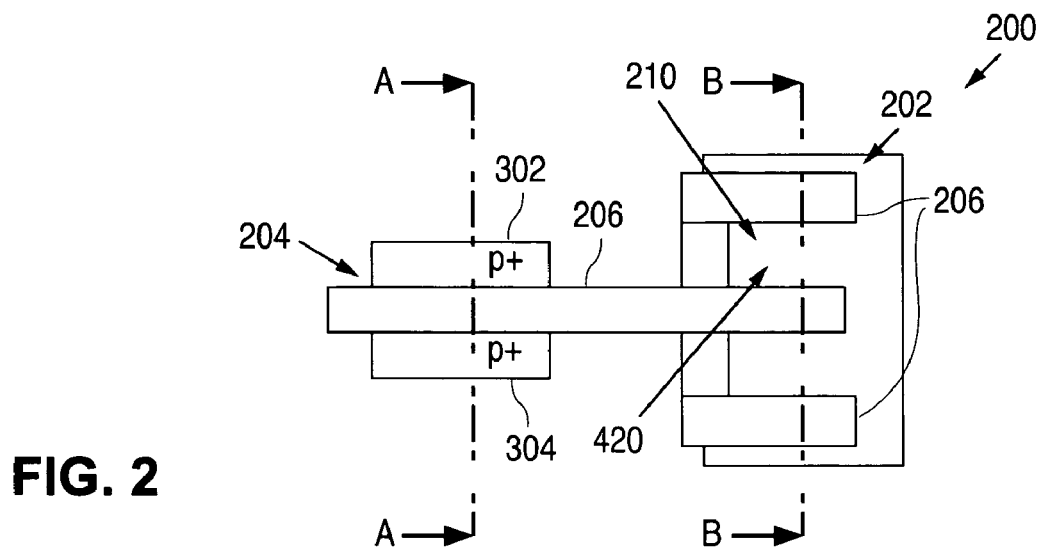
FIG. 2 is a plan view of another prior art EEPROM cell.
Figure 3:
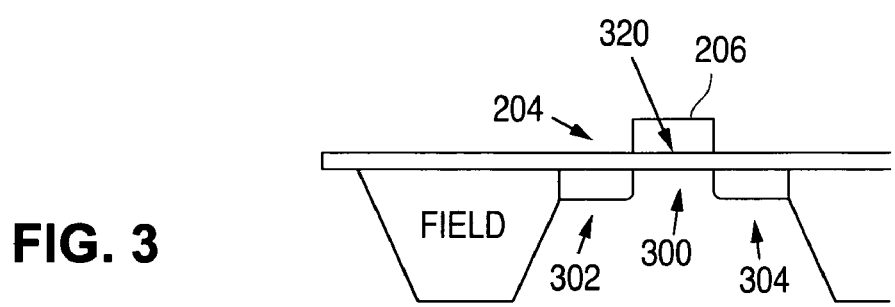
FIG. 3 is a sectional view of the EEPROM cell in FIG. 2 along line A—A.
Figure 4:
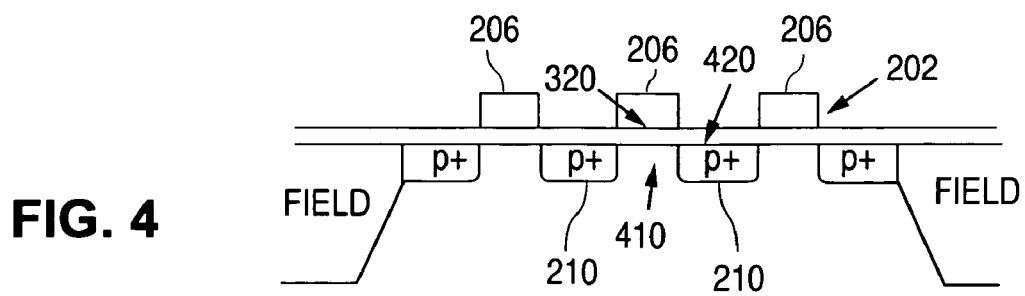
FIG. 4 is a sectional view of the EEPROM cell in FIG. 2 along line B—B
Figure 5:
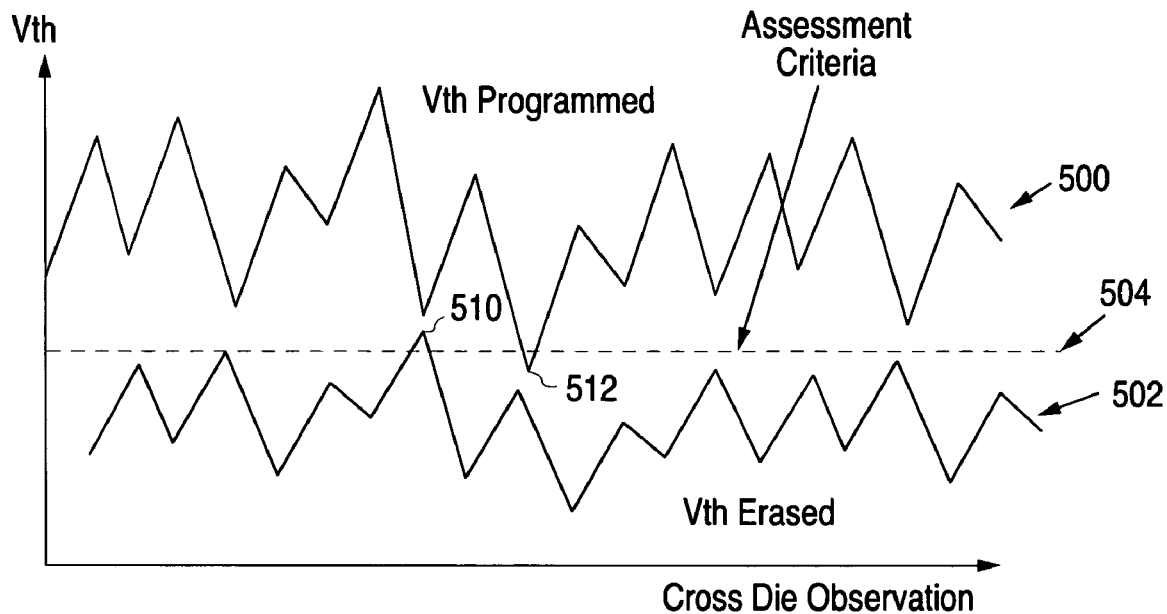
FIG. 5 shows threshold voltage curves for different memory cells across an EEPROM array.
Figure 6:
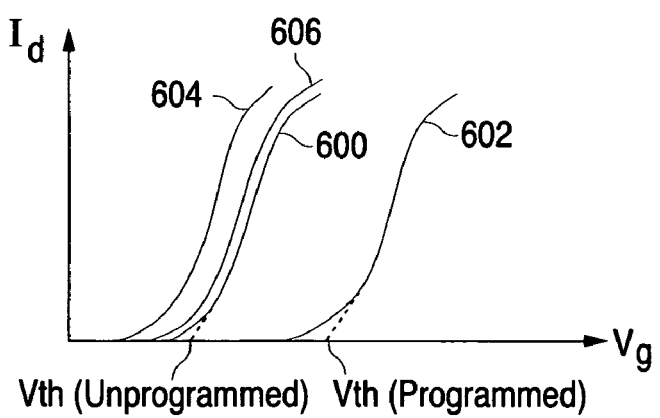
FIG. 6 shows Id vs. Vg curves for two different memory cells in their programmed and unprogrammed states.

This is best understood with reference to typical drain current (Id) versus gate voltage (Vg) curves for two different EEPROM cells, as shown in FIG. 6. Curve 600 shows the Id versus Vg curve for a first memory cell when unprogrammed. Curve 602 shows the curve for the same cell when programmed. It will be seen that a larger gate voltage is required to achieve drain current flow when the cell is programmed, i.e., when there is charge on the capacitors of the EEPROM cell. In particular, it will be noted that the difference between the two gate voltage levels is rather large. In contrast, the curves for a second cell are shown by curves 604, 606, where the unprogrammed cell is shown by curve 604, and the programmed cell is shown by 606. It will be noted that for this second cell, the gate voltage difference between the unprogrammed cell compared to the programmed cell is very small. Thus the task of providing an appropriate read voltage that falls between the threshold voltage for the unprogrammed cell and the programmed cell becomes more difficult in the case of the second cell. Furthermore, since drain current for the programmed second cell (curve 606) occurs at a lower threshold voltage than for the unprogrammed first cell (curve 600) it will be appreciated that there is no single read voltage that can be chosen for both cells as they stand now.

However, if the programming level could be adjusted, i.e., if the curve 600 could be moved to the left, or the curve 606 could be moved to the right, it would be possible to provide a single read voltage falling between the unprogrammed cell threshold voltages (curves 600, 604) on the one hand, and the programmed cell threshold voltages (curves 602, 606) on the other hand. For purposes of this application the moving of the curves to the left or right refers to the Id versus Vg curves of the memory cells which, in accordance with the invention, are moved to the right by adding charge to the capacitors of the memory cell or to the left by removing charge from the capacitors of the memory cells. Thus, it refers to the adjustment of the programming level in accordance with the invention. The term memory cells and EEPROM cells are also used interchangeable in the application.

As mentioned above, this adjustment of programming level (moving of the curves) is achieved in accordance with the invention by selectively precharging or pre-erasing the memory cells, i.e., by precharging or pre-erasing the capacitors of the memory cells. The degree of precharging or pre-erasing required depends on how much charge has to be added or removed from the capacitors of each of the EEPROM cells to ensure that all cells have a lower unprogrammed Vth than a chosen, common read voltage, and to ensure that all cells have a higher programmed Vth than the common read voltage. Insofar as any programmed cell's threshold voltage lies too far to the left, the cell has to be precharged, and insofar as any cell's unprogrammed Vth lies too far to the right, the cell has to have charge removed by Fowler-Nordheim effect, i.e. pre-erased.

For ease of discussion this precharging and pre-erasing will simply referred to hereafter as pre-programming.

Figure 7:
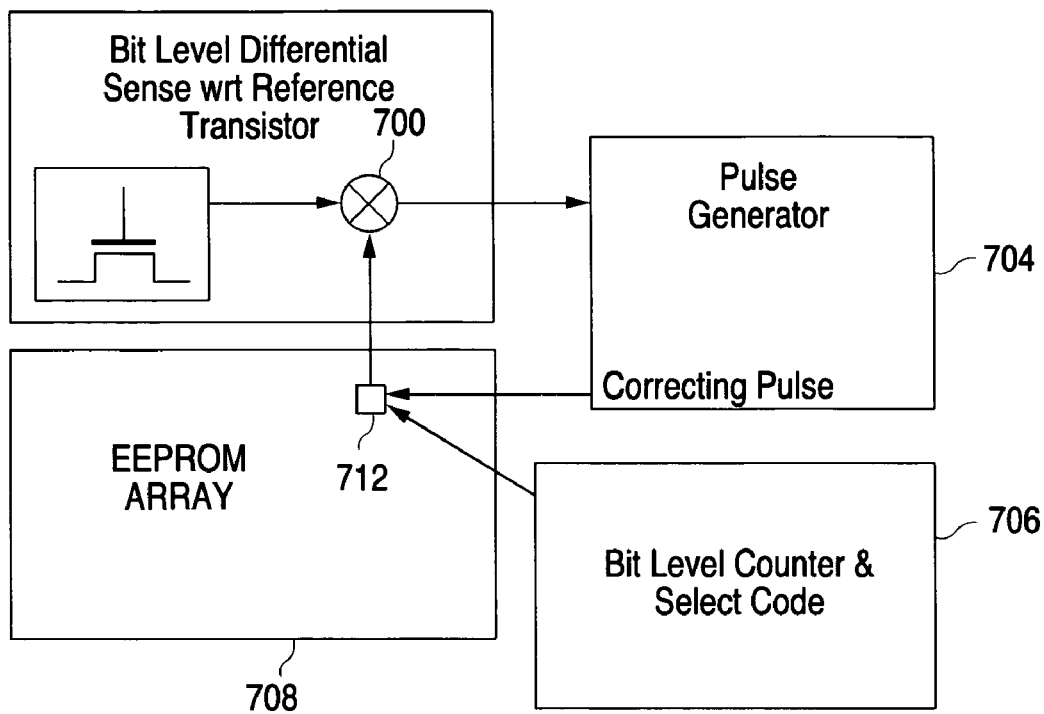
FIG. 7 is a block diagram of one embodiment of a precharge circuit of the invention.

One embodiment of a circuit for achieving the selective pre-programming (precharging and pre-erasing) of the memory cells in an array is shown in FIG. 7. The circuit of FIG. 7 includes a comparator 700, which compares each cell's programmed Vth (threshold voltage with the cell in a programmed state), to a reference voltage. Any difference Vdiff between the drain voltage of the EEPROM cell and the reference voltage is fed into a pulse generator 704, which sends a voltage pulse to the gate of the EEPROM cell, thereby adding charge to the capacitors of the cell. The difference is again measured and, if necessary, another pulse is provided to the gate of the EEPROM cell. A bit level counter 706 counts the number of pulses required reduce Vdiff substantially to zero. This pre-programming is done for each of the memory cells in the EEPROM array 708 thereby providing an array that has all the threshold voltages of the programmed cells moved to a common threshold voltage, ie., each cell afer pre-programming in accordance with the invention can thereafter be programmed (placed in a programmed state) by adding substantially the same amount of charge as for any of the other cells in the array. In other words, the pre-programming takes care of variations between the cells so that subsequent programming of any of the cells by a common programming voltage will result in cells that can be read by a common read voltage. Since a program counter 706 identifies the number of pulses, and thus the amount of charge required for the pre-programming, it is a simple matter thereafter to again pre-program the cells should they ever be erased. It will be appreciated that a single pre-program circuit such as the one shown in FIG. 7 can be used to pre-program each of the memory cells. Instead, a separate pre-program circuit can be provided for each cell.

Figure 8:
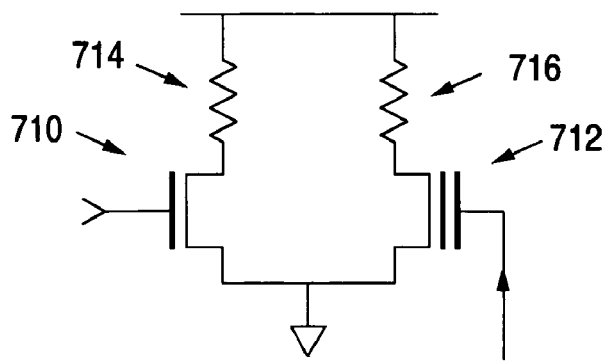
FIG. 8 is a circuit diagram of one embodiment of a simple comparator used in the circuit of FIG. 6.

In one embodiment, the comparator 700 defines the reference voltage by making use of a non-floating transistor 710, as shown more clearly in FIG. 8. By comparing the drain voltage of the EEPROM cell 712 to the drain voltage of the reference transistor 710, relative drain currents can be determined. Thus, measuring the difference in drain voltage provides the voltage difference Vdiff, which is fed into the pulse generator 704.

In the above discussion, the pulse generator 704 provided additional charge to the gate of the programmed EEPROM cell, thereby moving the programmed threshold voltage of the cell to the right. As mentioned above, however, the pulse can be either a charging pulse or an erase pulse (to perform pre-charging or pre-erasing) depending on the sign of the voltage difference Vdiff. In the case of a pre-erase pulse, the charge on the EEPROM cell capacitors is reduced by Fowler-Nordheim effect. In this way the pgrogrammed cell threshold voltage (programmed Vth) is moved to the left.

In the above embodiment, the reference transistor 710 was chosen for EEPROM cells in a programmed state. It will be appreciated that this reference can be adjusted by adjusting one or both of the resistors 714, 716, to allow EEPROM cells to be adjusted in their unprogrammed or erased state instead, i.e., before they have been programmed.

Since the EEPROM of the present invention allows all of the EEPROM cells to be pre-adjusted to pre-defined Vth values for both the programmed and unprogrammed states, it is now possible to define more than one programming state of an EEPROM cell. Instead of only being able to distinguish a programmed from an unprogrammed cell, it is now possible to refine the degree of granularity and allow degrees of charging to be determined. For instance, multiple degrees of charging, e.g., 8 levels of charging, can be defined each associated with a certain read voltage. In fact, analog values can now be stored on the EEPROM cells by simply determining the read voltage needed to achieve drain current. Thus, by determining the voltage level required on the EEPROM cell gate to achieve drain current, the amount of charge on the capacitors of the EEPROM can be ascertained, which determines the voltage level stored on the EEPROM cell.

Figure 9:
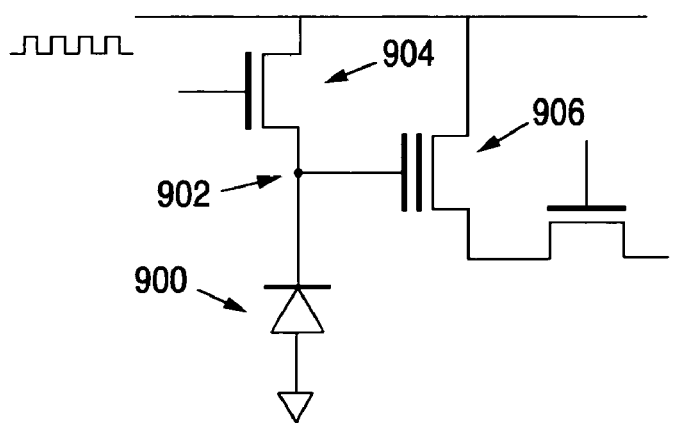
FIG. 9 is a simplified circuit diagram showing one application of a pre-charged EEPROM of the invention.

One application for a pre-charged EEPROM in accordance with the invention is in the field of imaging. FIG. 9 shows a simple imaging circuit in which a photo diode 900 controls the voltage at the node 902. A square wave is fed to the gate of an NMOS transistor 904, thereby providing voltage pulses at the node 902 when the photo diode is exposed to light. Thus, depending on the length of exposure to light, more pulses are passed through to the EEPROM 906. This builds up the charge on the EEPROM 906 and defines an analog value corresponding to the duration of light exposure of the photo diode 900.

It will be appreciated that different circuits can be devised for pre-charging the EEPROM cells in a memory array to achieve an array with uniform threshold voltage levels for both the programmed as well as the unprogrammed or erased state. Thus the invention is not to be construed as limited to any particular circuit but includes other embodiments within the scope of the claims.

What is claimed is:

1. A method of providing an EEPROM array with a common read voltage across all cells, comprising pre-programming the cells by adding or removing charge from the cells so that all of the cells have substantially the same threshold voltage, wherein the programmed threshold voltage is substantially the same for all the cells in the array and the unprogrammed threshold voltage is substantially the same for all the cells in the array the EEPROM cells each including two capacitors, and the step of adding or removing charge comprising adding or removing charge from the capacitors.

2. A method of claim 1, wherein a first of the capacitors is defined by a control gate separated from a floating gate, and the step of adding charge comprises applying a positive voltage to the control gate.

3. A method of cliam 2, wherein the second of the capacitors is defined by the floating gate spaced from an active region, and the step of removing charge comprises sucking off charge from the second capacitor.

4. A method of claim 1, wherein the pre-programming of each of the cells is done by providing a circuit that measures the threshold voltage of the cell in its erased state and compares it to a reference voltage, and adds or removes charge from the cell to align the threshold voltage substantially with the reference voltage.

5. A method of claim 4, wherein the adding or removing of charge is done iteratively by generating voltage pulses and counting the number of voltage pulses required to align the threshold voltage substantially with the reference voltage.

6. A method of providing a multi-cell EEPROM array capable of storing an analog value, comprising
   providing a multi-cell EEPROM array,
   pre-programming the cells so that all of the cells have substantially the same threshold voltage in their erased states and all of the cells have substantially the same threshold voltage in their programmed states, wherein both the programmed threshold voltage and the unprogrammed threshold voltage are substantially the same for all the cells in the array.

7. A method of claim 6, wherein the pre-programming comprises adding or removing charge from the cells and the EEPROM cells each include two capacitors, and the step of adding or removing charge comprises adding or removing charge from the capacitors.

8. A method of claim 7, wherein a first of the capacitors is defined by a control gate separated from a floating gate, and the step of adding charge comprises applying a positive voltage to the control gate.

9. A method of claim 8, wherein the second of the capacitors is defined by the floating gate spaced from an active region, and the step of removing charge comprises sucking off charge from the second capacitor.

10. A method of claim 6, wherein the pre-programming of each of the cells is done by providing a circuit that measures the threshold voltage of the cell in its erased state and compares it to a reference voltage, and adds or removes charge from the cell to align the threshold voltage substantially with the reference voltage.

11. A method of claim 10, wherein the adding or removing of charge is done iteratively by generating voltage pulses and counting the number of voltage pulses required to align the threshold voltage substantially with the reference voltage.

12. A method of claim 6, wherein the pre-programming of each of the cells is done by providing a circuit that measures the threshold voltage of the cell in its programmed state and compares it to a reference voltage, and adds or removes charge from the cell to align the threshold voltage substantially with the reference voltage, wherein the adding or removing of charge is done iteratively by generating voltage pulses and counting the number of voltage pulses required to align the threshold voltage substantially with the reference voltage.

13. A method of providing a multi-cell EEPROM array wherein each cell is capable of storing multiple values, comprising
   providing a multi-cell EEPROM array,
   pre-programming the cells so that all of the cells have substantially the same threshold voltage in their erased states and all of the cells have substantially the same threshold voltage in their programmed states, wherein both the programmed threshold voltage and the unprogrammed threshold voltage are substantially the same for all the cells in the array.

14. A method of claim 13, wherein the pre-programming comprises adding or removing charge from the cells and the EEPROM cells each include two capacitors, and the step of adding or removing charge comprises adding or removing charge from the capacitors.

15. A method of claim 14, wherein a first of the capacitors is defined by a control gate separated from a floating gate, and the step of adding charge comprises applying a positive voltage to the control gate.

16. A method of claim 15, wherein the second of the capacitors is defined by the floating gate spaced from an active region, and the step of removing charge comprises sucking off charge from the second capacitor.

17. A method of claim 14, wherein the pre-programming of each of the cells is done by providing a circuit that measures the threshold voltage of the cell in its erased state and compares it to a reference voltage, and adds or removes charge from the cell to align the threshold voltage substantially with the reference voltage.

18. A method of claim 17, wherein the adding or removing of charge is done iteratively by generating voltage pulses and counting the number of voltage pulses required to align the threshold voltage substantially with the reference voltage.

* * * * *